(12) United States Patent
Setlur et al.

(10) Patent No.: US 8,057,706 B1
(45) Date of Patent: Nov. 15, 2011

(54) MOISTURE-RESISTANT PHOSPHOR AND ASSOCIATED METHOD

(75) Inventors: Anant Achyut Setlur, Niskayuna, NY (US); Oltea Puica Siclovan, Rexford, NY (US); Robert Joseph Lyons, Burnt Hills, NY (US); Ljudmil Slavchev Grigorov, Sofia (BG)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 12/843,947

(22) Filed: Jul. 27, 2010

(51) Int. Cl.
- *C09K 11/61* (2006.01)
- *C09K 11/66* (2006.01)
- *C09K 11/70* (2006.01)
- *C09K 11/77* (2006.01)
- *B32B 5/16* (2006.01)

(52) U.S. Cl. ... 252/301.4 H; 252/301.4 F; 252/301.6 R; 252/301.4 R; 428/403

(58) Field of Classification Search ........... 252/301.4 R, 252/301.6 R, 301.6 F, 301.4 F, 301.4 H; 313/467, 313/468; 428/403, 423; 427/64, 212
See application file for complete search history.

(56) References Cited

U.S. PATENT DOCUMENTS

| | | | | |
|---|---|---|---|---|
| 5,626,957 A | * | 5/1997 | Benso et al. | 428/323 |
| 6,242,043 B1 | * | 6/2001 | Lipp | 427/64 |
| 7,497,973 B2 | * | 3/2009 | Radkov et al. | 252/301.4 H |
| 7,648,649 B2 | * | 1/2010 | Radkov et al. | 252/301.4 H |
| 2007/0054120 A1 | * | 3/2007 | Meyer et al. | 428/403 |
| 2009/0020775 A1 | | 1/2009 | Radkov et al. | |

FOREIGN PATENT DOCUMENTS

| | | |
|---|---|---|
| GB | 2285535 A | 7/1995 |
| WO | 2007087480 A2 | 8/2007 |

OTHER PUBLICATIONS

N. Avci, J. Musschoot, P. F. Smet, K. Korthout, A. Avci, C. Detavernier and D. Poelman; Microencapsulation of Moisture-Sensitive CaS:Eu2+ Particles with Aluminum Oxide; Journal of the Electrochemical Society, 156 11 J333-J337 2009.

* cited by examiner

*Primary Examiner* — Jerry A Lorengo
*Assistant Examiner* — Lynne Edmondson
(74) *Attorney, Agent, or Firm* — Francis T. Coppa

(57) ABSTRACT

A phosphor material contains encapsulated particles of manganese ($Mn^{4+}$) doped fluoride phosphor. A method of encapsulating such particles is also provided. Each particle is encapsulated with a layer of a manganese-free fluoride phosphor. The use of such a phosphor material in a lighting apparatus results in improved stability and acceptable lumen maintenance over the course of the apparatus life.

24 Claims, 3 Drawing Sheets

MOISTURE-RESISTANT PHOSPHOR AND ASSOCIATED METHOD

BACKGROUND

The invention relates generally to phosphor materials, and particularly to red emitting phosphors. More particularly, the invention relates to moisture-resistant phosphors, and a lighting apparatus employing these phosphors.

Light emitting diodes (LEDs) are semiconductor light emitters often used as a replacement for other light sources, such as incandescent lamps. They are particularly useful as display lights, warning lights and indicator lights, or in other applications where colored light is desired. The color of light produced by an LED is dependent on the type of semiconducting material used in its manufacture.

Colored semiconductor light emitting devices, including light emitting diodes and lasers (both are generally referred to herein as LEDs), have been produced from Group III-V alloys such as gallium nitride (GaN). With reference to the GaN-based LEDs, light is generally emitted in the UV-to-green range of the electromagnetic spectrum. Until quite recently, LEDs have not been suitable for lighting uses where a bright white light is needed, due to the inherent color of the light produced by the LED.

Recently, techniques have been developed for converting the light emitted from LEDs to useful light for illumination purposes. In one technique, the LED is coated or covered with a phosphor layer. A phosphor is a luminescent material that absorbs radiation energy in a portion of the electromagnetic spectrum, and emits energy in another portion of the electromagnetic spectrum. Phosphors of one important class are crystalline inorganic compounds of high chemical purity, and of controlled composition, to which small quantities of other elements (called "activators") have been added to convert them into efficient fluorescent materials. With the appropriate combination of activators and inorganic compounds, the color of the emission can be controlled. Most useful and well-known phosphors emit radiation in the visible portion of the electromagnetic spectrum in response to excitation by electromagnetic radiation outside the visible range.

By interposing a phosphor excited by the radiation generated by the LED, light of a different wavelength, e.g., in the visible range of the spectrum, may be generated. Colored LEDs are often used in toys, indicator lights and other devices. Continuous performance improvements have enabled new applications for LEDs of saturated colors in traffic lights, exit signs, store signs, and the like.

In addition to colored LEDs, a combination of LED generated light and phosphor generated light may be used to produce white light. The most popular white LEDs consist of blue emitting GaInN chips. The blue emitting chips are coated with a phosphor that converts some of the blue radiation to a complementary color, e.g. a yellowish emission. Together, the blue and yellowish radiation produces a white light. There are also white emitting LEDs that are designed to convert the UV radiation to visible light. These LEDs utilize a near UV emitting chip and a phosphor blend including red, green and blue emitting phosphors, and produces white light.

In many white light applications, phosphors with line emission spectra (e.g., $Y_2O_3$: $Eu^{3+}$) are preferred as the red component, because they maximize the luminous efficacy of radiation (LER) at acceptable color-rendering index (CRI) values (e.g. 80-86), over the correlated color temperature (CCT) range of interest (e.g. 3000-6500K). These red fluorescent lamp phosphors, doped with $Eu^{3+}$, cannot be used successfully in UV LED lamps because they have virtually no absorption of near-UV (370-420 nm) light, leading to unacceptable light loss, due to scattering by the phosphor. Currently, a class of phosphors based on manganese ($Mn^{4+}$) doped complex fluorides can be used in LED lamps, due to having their main emission peak at a wavelength ranging from 300 nm to 520 nm. These fluoride phosphors usually have high quantum efficiency, and their narrow red line emission leads to potential use in warm white light. Warm white LEDs (CCT<4500K) have high CRI (>80), and also have a high lumen equivalent.

However, these fluoride phosphors are sensitive to moisture, and degrade under high temperature (more than about 60 degrees Celsius) and high humidity conditions. The phosphor often turns brown, probably due to hydrolysis of $MnF_6^{-2}$ ion to hydrated manganese dioxide, which leads to significant deterioration of the brightness of these phosphors.

It would therefore be desirable to produce fluoride phosphors that are resistant to moisture-induced degradation, in order to prolong the light emission of LEDs. Moreover, the new fluoride phosphor can provide the advantage of simple packaging methods, e.g., those that may require less of a hermetic seal. It would also be very desirable to develop an improved LED that incorporates such moisture-protected phosphors.

BRIEF DESCRIPTION

One embodiment is a phosphor material containing individual particles of manganese ($Mn^{4+}$) doped fluoride phosphor, wherein each particle is encapsulated with a layer of a manganese-free fluoride phosphor.

Another embodiment is a lighting apparatus. The lighting apparatus includes a light source and a phosphor material radiationally coupled to the light source. The phosphor material contains individual particles of manganese ($Mn^{4+}$) doped fluoride phosphor, wherein each particle is encapsulated with a layer of a manganese-free fluoride phosphor.

According to one embodiment of the invention, a method of encapsulating manganese-doped fluoride phosphor particles is provided. A saturated solution of a manganese-free fluoride phosphor is prepared and mixed with manganese-doped fluoride phosphor powder to form a suspension. The suspension is evaporated until a paste is formed, which is then dried to produce a powder comprising all encapsulated particles.

DRAWINGS

These and other features, aspects, and advantages of the present invention will become better understood when the following detailed description is read with reference to the accompanying drawings, wherein.

DETAILED DESCRIPTION

Figure 1:
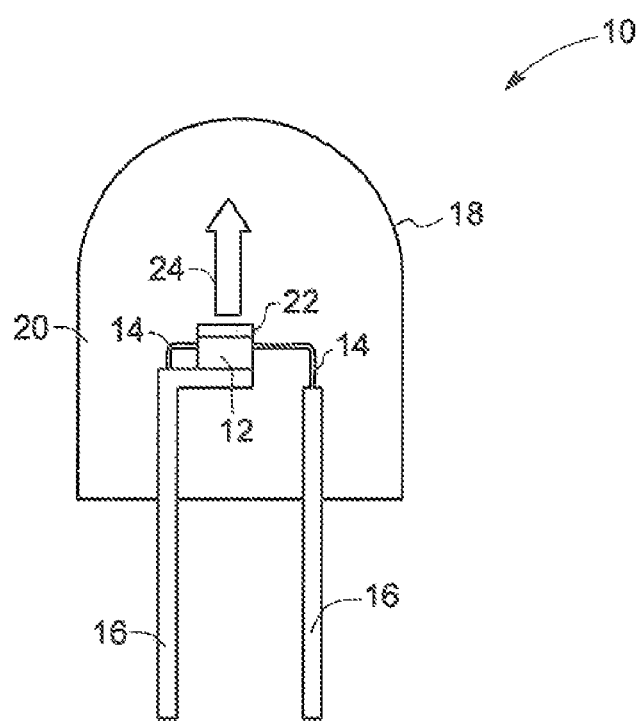
FIG. 1 is a schematic cross-sectional view of a lighting apparatus in accordance with one embodiment of the invention.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

In the following specification and claims, the singular forms "a", "an" and "the" include plural referents, unless the context clearly dictates otherwise.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable, or suitable. For example, in some circumstances, an event or capacity can be expected, while in other circumstances the event or capacity cannot occur—this distinction is captured by the terms "may" and "may be".

As discussed in detail below, some of the embodiments of the present invention provide a phosphor material that is resistant to moisture, and a method to prepare such a composition. These embodiments advantageously provide a coating for individual particles of moisture sensitive phosphors, for example, a manganese doped fluoride phosphor, to protect them from atmospheric conditions. Use of such phosphors and blends in LED or other light sources is also presented. Although the present discussion provides examples in the context of manganese doped fluorides, these processes can be applied to other phosphors containing moisture sensitive elements.

As used herein, the term "phosphor", "phosphor composition" or "phosphor material" may be used to denote both a single phosphor composition, as well as a blend of two or more phosphor compositions. In one embodiment, the phosphor contains at least a fluoride phosphor (red phosphor). In some embodiments, the phosphor contains a blend of blue, red and green phosphors. The blue, red and green phosphors are so called or known after the color of their light emission.

According to one embodiment of the invention, a phosphor material having moisture protection is provided. Individual particles of manganese-doped fluoride phosphor are encapsulated by a layer of manganese-free fluoride phosphor material, in order to improve their resistance to moisture-induced degradation. In other words, the phosphor material may have a core-shell structure. Substantially all of the core particles of manganese-doped fluoride phosphor (also referred to as "core phosphor") are coated with a thin protective layer of manganese-free fluoride (also referred to as "shell phosphor"). Advantageously, the thin protective layer has significantly less degradation under high temperature and high humidity conditions, as compared to the core particles, thereby protecting the core particles from the effects of atmospheric moisture. In preferred embodiments, every particle is covered with the protective shell layer. However, if a small number of particles do not become fully covered under processing conditions, the overall characteristics of the phosphor would not be adversely affected for most applications.

The fluoride phosphor is typically a complex fluoride phosphor, and may comprise one or more of (1) $A_2[MF_6]$, where A is selected from Li, Na, K, Rb, Cs, $NH_4$, and combinations thereof; and where M is selected from Ge, Si, Sn, Ti, Zr, Hf, and combinations thereof; (2) $A_2[MF_5]$, where A is selected from Li, Na, K, Rb, Cs, $NH_4$, and -combinations thereof; and where M is selected from Al, Ga, In, Sc, and combinations thereof; (3) $E[MF_6]$, where E is selected from Mg, Ca, Sr, Ba, Zn, and combinations thereof; and where M is selected from Ge, Si, Sn, Ti, Zr, Hf, and combinations thereof; (4) $A_3[MF_6]$, where A is selected from Li, Na, K, Rb, Cs, $NH_4$, and combinations thereof; and where M is selected from Al, Ga, In, Sc, Y, La, a lanthanide, Bi, and combinations thereof; (5) $A_2[MF_7]$, where A is selected from Li, Na, K, Rb, Cs, NH4, and combinations thereof; and where M is selected from Nb, Ta, and combinations thereof; (6) $Zn_2[MF_7]$, where M is selected from Al, Ga, In, and combinations thereof; (7) $Ba_{0.65}Zr_{0.35}F_{2.70}$, (8) $A[In_2F_7]$; where A is selected from Li, Na, K, Rb, Cs, NH4 and combinations thereof; or (9) $A_3[MF_7]$; where A is selected from Li, Na, K, Rb, Cs, NH4, and combinations thereof, and where M is selected from Zr, Si, Ge, Sn, Ti, and Hf and combinations there of.

As used herein, "complex fluoride phosphor" means that the phosphor is a coordination compound, containing at least one coordination center (for example "M" in the examples above), surrounded by fluoride ions acting as ligands, and charge-compensated by counter ions (e.g. "A" or "E" in the examples above), as necessary. Complex fluorides are occasionally written down as a combination of simple, binary fluorides (e.g. $EF_2.MF_4$ instead of $E[MF_6]$), but such a representation does not indicate the coordination number (in this example, 6) for the ligands around the coordination center. The square brackets (occasionally omitted for simplicity) indicate that the complex ion they encompass is a species that is different from the simple fluoride ion. These complex fluorides may further include an activator ion, for example manganese ion ($Mn^{4+}$), and may also be referred as manganese-doped fluoride phosphor. The activator ion ($Mn^{4+}$) also acts as a coordination center, substituting part of the centers of a host phosphor lattice, e.g., M. The host phosphor lattice (including the counter ions) can further modify the excitation and emission properties of the activator ion.

A same or different host phosphor may be used to prepare the core phosphor particles and the shell phosphor in the core-shell structure (discussed above). The core phosphor particles may include one or more of the above fluoride phosphors that are activated with manganese ($Mn^{4+}$). A manganese-free fluoride phosphor may be used to encapsulate individual particles of the core phosphor that is manganese-doped. In some embodiments, the shell phosphor may be the same material as that used as the host phosphor for the core particle. In some other embodiments, the shell phosphor is different from the host phosphor used for core particles.

A variety of methods may be used to prepare manganese-doped or manganese-free fluoride phosphors, depending on different starting materials, methods to provide a manganese activator in the proper oxidation state, and the like. Some of preferred methods are described in U.S. Pat. No. 7,497,973, which is incorporated herein by reference.

One embodiment provides a method of encapsulating manganese-doped fluoride phosphor particles with manganese-free fluoride phosphor. A saturated solution of manganese-free fluoride phosphor can first be prepared in an acid. Examples of the acid used to prepare the saturated solution may include HF, $NH_4HF_2$, $NH_4F$ or a combination thereof. The saturated solution is then mixed with a powder of manganese-doped fluoride phosphor by pouring the solution onto manganese-doped fluoride phosphor powder in the vessel, with continuous stirring to form a suspension. A thick paste can then be recovered by evaporating the suspension, and drying the residue on a filter paper. The thick paste may be dried in a dry box atmosphere to recover or produce a powder having encapsulated particles. The drying of the paste may be carried out at about 10 degrees Celsius to about 300 degrees Celsius, and more specifically at about 50 degrees Celsius to about 200 degrees Celsius.

The moisture-resistant fluoride phosphor provided by embodiments of the present invention has an intense red luminescence property for electromagnetic excitations corresponding to the various absorption fields of the product. These fluoride phosphors may be desirably used in lighting or display systems. One embodiment of the invention is directed to a lighting apparatus that includes the phosphor material radiationally coupled to the light source. As used herein, the term "radiationally coupled" means that the elements are associated with each other so that at least part of the radiation emitted from one is transmitted to the other. As discussed in above embodiments, the phosphor material contains manganese-doped fluoride phosphor particles, which are encapsulated with a layer of manganese-free fluoride phosphor.

Non-limiting examples of lighting apparatus or devices include UV excitation devices, such as in chromatic lamps, lamps for backlighting liquid crystal systems, plasma screens, xenon excitation lamps, devices for excitation by light-emitting diodes (LEDs), fluorescent lamps, cathode ray tubes, plasma display devices, liquid crystal displays (LCD's), and UV excitation marking systems. The fluoride phosphor may also be used as a scintillator in an electromagnetic calorimeter, in a gamma ray camera, in a computed tomography scanner, or in a laser. These uses are meant to be merely exemplary and not exhaustive.

In one embodiment, the lighting apparatus is an LED lamp. An LED lamp that produces a white light would be useful to impart desirable qualities to LEDs as light sources. Therefore, in one embodiment, a phosphor material blend (phosphor blend) coated LED chip is provided for producing white light. The phosphor blends presented in this embodiment enable white light with an optimal combination of properties. These include relatively high color-rendering index (CRI) values, and a luminous efficacy of radiation (LER, expressed in lumen/W), at any correlated color temperature (CCT) of interest, when excited by radiation from about 250 to 550 nm (as emitted by a near UV to green LED).

The color-rendering index (CRI) (sometimes called color rendition index), is a quantitative measure of the ability of a light source to reproduce the colors of various objects faithfully, in comparison with an ideal or natural light source. Light sources with a high CRI are desirable in color-critical applications such as photography and cinematography. The term "CRI" is defined by the International Commission on Illumination as the effect of an illuminant on the color appearance of objects by conscious or subconscious comparison with their color appearance under a reference illuminant. The CRI by itself does not indicate the color temperature of the reference light source. Therefore, it is customary to also cite the correlated color temperature (CCT).

As discussed above, manganese-doped fluoride phosphors, typically, are very sensitive to moisture, and degrade under high temperature and high humidity conditions. The present invention advantageously provides the potential ability to use manganese-doped fluoride phosphors in such an environment. Furthermore, these phosphors are less likely to undesirably react with any component within an LED package, due to the encapsulation. These encapsulated particles of manganese-doped fluoride phosphors can also provide a combination of high lumen equivalents and high CRI values in LED lighting. Moreover, being moisture-resistant in nature, the fluoride phosphor can minimize the need for hermetic packaging of components of the lighting apparatus, as mentioned previously.

With reference to FIG. 1, an exemplary LED based light emitting assembly or lamp 10 is shown in accordance with one preferred structure of the present invention. The light emitting assembly 10 comprises a semiconductor UV or visible radiation source, such as a light emitting diode (LED) chip 12, and leads 14, which are electrically attached to the LED chip. The leads 14 may comprise thin wires supported by a thicker lead frame (or multiple frames) 16. Alternatively, the leads may comprise self-supported electrodes, and the lead frame may be omitted. The leads 14 provide current to the LED chip 12, and thus cause the LED chip 12 to emit radiation.

The lamp may include any visible or UV light source that is capable of producing white light when its emitted radiation is directed onto the phosphor. Typically, the light source comprises a semiconductor LED doped with various impurities. The LED may comprise a semiconductor diode based on any suitable III-V, II-VI or IV-IV semiconductor layer structure. The desirable peak emission of the LED in the present invention will depend on the identity of the phosphors in the disclosed embodiments, and may range from, e.g., 250-550 nm. In some specific embodiments, however, the emission of the LED will be in the near UV to blue-green region, with a peak wavelength in the range from about 370 nanometers to about 500 nanometers.

Preferably, the LED may contain at least one semiconductor layer comprising GaN, ZnO or SiC. For example, the LED may comprise a nitride compound semiconductor represented by the formula $In_iGa_jAl_kN$ (where $0 \leq i$; $0 \leq j$; $0 \leq k$ and $i+j+k=1$), having a peak emission wavelength greater than about 250 nm, and less than about 550 nm. Such LED semiconductors are known in the art. The radiation or light source is described herein as an LED for convenience. However, as used herein, the term is meant to encompass all semiconductor radiation sources including, e.g., semiconductor laser diodes.

Although the general discussion of the exemplary structures of the invention discussed herein are directed toward inorganic LED based light sources, it should be understood that the LED chip may be replaced by an organic light emissive structure or other radiation source, unless otherwise noted, and that any reference to an LED chip or semiconductor is merely representative of any appropriate radiation source.

With reference to FIG. 1, the LED chip 12 may be encapsulated within an envelope 18, which encloses the LED chip and an encapsulant material 20. The envelope 18 may be, for example, glass or plastic. Preferably, the LED 12 is substantially centered in the encapsulant 20. The encapsulant 20 is preferably a polymer (plastic), resin, low temperature glass, or other type of LED encapsulating material as is known in the art. In one embodiment, the encapsulant 20 is a spin-on glass or some other material having a high index of refraction. In one embodiment, the encapsulant material 20 is a polymer material, such as epoxy, silicone, or silicone epoxy, although other organic or inorganic encapsulants may be used. Thermoplastic or thermosetting polymers may also be used. In an alternate embodiment, the lamp 10 may only comprise an encapsulant without an outer envelope 18. The LED chip 12 may be supported, for example, by the lead frame 16, by the self-supporting electrodes, by the base of the envelope 18, or by a pedestal (not shown) mounted to the shell or to the lead frame.

The structure of the lighting apparatus, which constitutes the lamp, includes a phosphor material 22 radiationally coupled to the LED chip 12. The phosphor material 22 can be deposited on the LED 12 by any appropriate method. For example, a suspension of the phosphor can be formed, and applied as a phosphor layer to the LED surface. In one such method, a silicone, epoxy or other matrix material is used (either directly or diluted with an organic solvent, e.g. acetone, MIBK or butyl acetate) to create a slurry in which the phosphor particles are randomly suspended and placed around the LED. This method is merely exemplary for possible positions of the phosphor 22, relative to LED 12. Thus, the phosphor 22 may be coated over or directly onto the light emitting surface of the LED chip 12, by coating and drying or curing the phosphor suspension over the LED chip 12. Both the envelope 18 and the encapsulant 20 should be transparent to allow light 24 to be transmitted through. Although not intended to be limiting, the median particle size of the phosphor material as measured using light scattering methods or via microscope (electron or optical) measurements may be from about 1 to about 20 microns.

Figure 2:
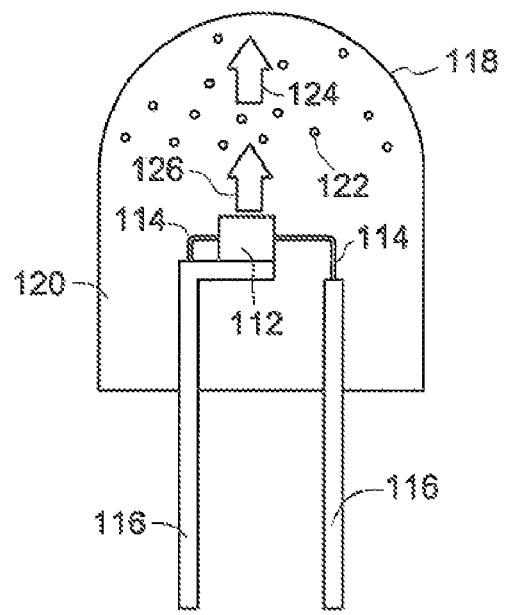
FIG. 2 is a schematic cross-sectional view of a lighting apparatus in accordance with another embodiment of the invention.

FIG. 2 illustrates a second preferred structure of the system according to the preferred aspect of the present invention. Corresponding numbers from FIGS. 1-4 (e.g. 12 in FIGS. 1 and 112 in FIG. 2) relate to corresponding structures in each of the figures, unless otherwise stated. The structure of the embodiment of FIG. 2 is similar to that of FIG. 1, except that the phosphor material 122 is interspersed within the encapsulant material 120, instead of being formed directly on the LED chip 112. The phosphor (in the form of a powder) may be interspersed within a single region of the encapsulant material or, more preferably, throughout the entire volume of the encapsulant material. Radiation (indicated by arrow 126) emitted by the LED chip 112 mixes with the light emitted by the phosphor 122, and the mixed light appears as white light 124. If the phosphor is to be interspersed within the encapsulant material 120, then a phosphor powder may be added to a polymer precursor, and loaded around the LED chip 112. The polymer precursor may then be cured to solidify the polymer. Other known phosphor interspersion methods may also be used, such as transfer molding.

Figure 3:
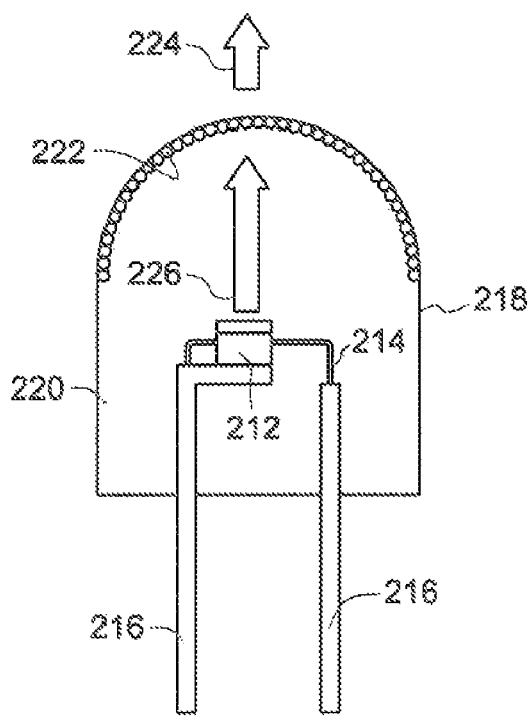
FIG. 3 is a schematic cross-sectional view of a lighting apparatus in accordance with yet another embodiment of the invention.

FIG. 3 illustrates a third possible structure of the system according to some preferred aspects of the present invention. The structure of the embodiment shown in FIG. 3 is similar to that of FIG. 1, except that the phosphor material 222 is coated onto a surface of the envelope 218, instead of being formed over the LED chip 212. The phosphor material 222 is preferably coated on the inside surface of the envelope 218, although the phosphor may be coated on the outside surface of the envelope, if desired. The phosphor 222 may be coated on the entire surface of the envelope, or only a top portion of the surface of the envelope. The radiation 226 emitted by the LED chip 212 mixes with the light emitted by the phosphor 222, and the mixed light appears as white light 224. Of course, the structures of FIGS. 1-3 may be combined, and the phosphor may be located in any two or all three locations, or in any other suitable location, such as separately from the envelope, or integrated into the LED.

In any of the above structures, the lamp 10 {as exemplified in FIG. 1) may also include a plurality of scattering particles (not shown), which are embedded in the encapsulant material. The scattering particles may comprise, for example, $Al_2O_3$ particles (such as alumina powder) or $TiO_2$ particles. The scattering particles effectively scatter the coherent light emitted from the LED chip, preferably with a negligible amount of absorption.

Figure 4:
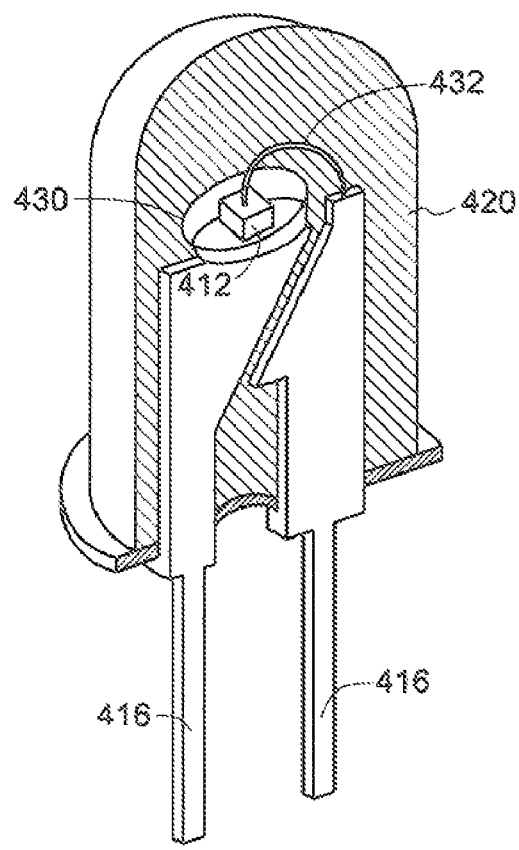
FIG. 4 is a cutaway side perspective view of a lighting apparatus in accordance with one embodiment of the invention.

As shown in a fourth preferred structure in FIG. 4, the LED chip 412 may be mounted in a reflective cup 430. The cup 430 may be made from or coated with a reflective material, such as alumina, titania, or other dielectric powders known in the art. A preferred reflective material is $Al_2O_3$. The remainder of the structure of the embodiment of FIG. 4 is the same as those of any of the previous figures, and can include two leads 416, a conducting wire 432, and an encapsulant material 420. The reflective cup 430 is supported by the first lead 416 and the conducting wire 432 is used to electrically connect the LED chip 412 with the second lead 416.

Figure 5:
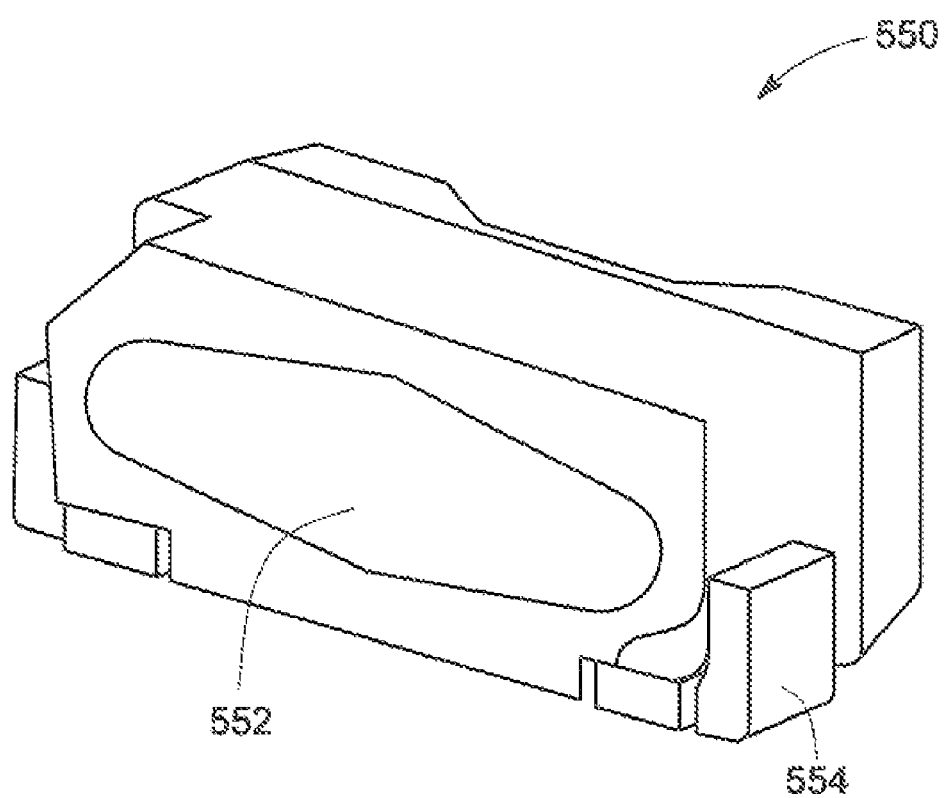
FIG. 5 is a schematic perspective view of a surface-mounted device (SMD) backlight LED.

Another structure (particularly for backlight applications) is a surface mounted device ("SMD") type light emitting diode 550, e.g. as illustrated in FIG. 5. This SMD is a "side-emitting type" and has a light-emitting window 552 on a protruding portion of a light guiding member 554. The SMD type light emitting diodes 550 can be made by disposing LEDs that have been formed beforehand by flow soldering or the like on a glass epoxy substrate, whereon an electrically conductive pattern has been formed and covering the LED with the window 552. An SMD package may comprise an LED chip as defined above, and a phosphor material that is excited by the light emitted from the LED chip.

In one embodiment, the phosphor material includes some additional phosphors, i.e. a blend of phosphors may be used in the lighting apparatus. When used with an LED chip emitting at from 250 to 550 nm, additional phosphors (such as blue and green emitting phosphors) can be used, providing a white LED. Some of the additional phosphors are described in more detail in U.S. Pat. No. 7,497,973, as mentioned above. In addition, other phosphors may be used, e.g., those emitting throughout the visible spectrum region, at wavelengths substantially different from those of the phosphors described herein. These additional phosphors may be used in the blend to customize the white color of the resulting light, and to produce sources with improved light quality.

Depending on the identity of the specific phosphors, a lighting apparatus may be produced having CRI ($R_a$) values greater than about 80, and preferably greater than about 90. The CCT values are preferably less than about 3500K, and in some instances, less than about 3000K.

When the phosphor material includes a blend of two or more phosphors, the ratio of each of the individual phosphors in the phosphor blend may vary, depending on the characteristics of the desired light output. The relative proportions of the individual phosphors in the various phosphor blends may be adjusted, so that when their emissions are blended and employed in a lighting device, there is produced visible light of predetermined x and y values on the CIE (International Commission on Illumination) chromaticity diagram. As stated, a white light is preferably produced. This white light may, for instance, possess an x value in the range of about 0.30 to about 0.55, and a y value in the range of about 0.30 to about 0.55.

It may be desirable to add pigments or filters to the phosphor material. When the LED is a UV emitting LED, the phosphor layer 22 may also comprise from 0 up to about 10% by weight (based on the total weight of the phosphors) of a pigment or other UV absorbent material capable of absorbing or reflecting UV radiation having a wavelength between 200 nm and 450 nm.

Suitable pigments or filters include any of those known in the art that are capable of absorbing radiation generated between 200 nm and 450 nm. Such pigments include, for example, nickel titanate or praseodymium zirconate. The pigment may be used in an amount effective to filter 10% to 100% of the radiation generated in the 200 nm to 500 nm ranges.

EXAMPLES

The example that follows is merely illustrative, and should not be construed to be any sort of limitation on the scope of the claimed invention.

Example 1

Preparation of complex fluoride phosphor having $K_2TiF_6$:$Mn^{4+}$ core with $K_2TiF_6$ coating (shell).

Manganese-free $K_2TiF_6$ was obtained commercially from Fluka, and manganese-doped $K_2TiF_6$ was prepared according to a procedure described in the referenced U.S. Pat. No. 7,497,973, in a 70 percent HF solution with a drying temperature of 70 degrees Celsius.

3 grams of $K_2TiF_6$ was mixed in 5 milliliters of 70 percent HF in a water bath at 70-90 degrees Celsius to prepare a saturated solution. This saturated solution was then poured onto 3 grams of $K_2TiF_6$:$Mn^{4+}$ powder in a beaker, which was placed in a water bath and, in some instances, in an oil bath. The solution was continuously stirred at about 70 degrees Celsius while pouring. A suspension was recovered after stirring for about 15 minutes, which was then evaporated to a thick paste at about 70 degrees Celsius. The thick paste was then poured out on a filter paper to dry. The drying was carried out in a dry box atmosphere at about 100 degrees Celsius.

Spectrometer Measurements (Luminescent Intensity Measurements)

0.72 grams of the above prepared coated phosphor was mixed with 0.88 grams of RTV-615™ silicone elastomer from Momentive Performance Materials to prepare a phosphor-silicone slurry (Slurry I). Slurry I was poured into an aluminum holder used for spectrometer measurements. Similarly, a slurry II mixture was prepared with $K_2TiF_6$:$Mn^{4+}$ phosphor powder (without any coating) mixed with the silicone. The slurry II was also poured into another aluminum holder. The luminescent intensity was then measured at 450 nanometers excitation for both slurry I and slurry II. Both the aluminum holders were placed in a humidity chamber and exposed to an 80 degrees Celsius and 80 percent RH environment, to test the moisture resistance of the phosphors. The environment was formed by a saturated KCl solution in the chamber. The holders were removed from the humidity chamber. The luminescent intensity was then measured again for slurry I and II. Slurry II, having uncoated phosphor particles, became brown, due to manganese oxidation. The slurry also exhibited severe degradation, with about 90 percent loss in luminescent intensity. In contrast, no significant change in color was observed for slurry I, which included the coated (encapsulated) fluoride phosphor particles. Furthermore, slurry I showed less than about 1% loss in luminescent intensity, under the same testing conditions as applied for Slurry II.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A phosphor material comprising individual particles of manganese ($Mn^{4+}$) doped fluoride phosphor, wherein each particle is encapsulated with a layer of a manganese-free fluoride phosphor.

2. The phosphor material of claim 1, wherein the $Mn^{4+}$ (manganese) doped fluoride phosphor is a material comprising at least one of:
   (A) $A_2[MF_6]$:$Mn^{4+}$, where A is selected from Li, Na, K, Rb, Cs, $NH_4$, and combinations thereof; and M is selected from Ge, Si, Sn, Ti, Zr, Hf and combinations thereof;
   (B) $A_2[MF_5]$:$Mn^{4+}$, where A is selected from Li, Na, K, Rb, Cs, $NH_4$, and combinations thereof; and where M is selected from Al, Ga, In, Sc and combinations thereof;
   (C) $E[MF_6]$:$Mn^{4+}$, where E is selected from Mg, Ca, Sr, Ba, Zn, and combinations thereof; and where M is selected from Ge, Si, Sn, Ti, Zr, Hf and combinations thereof;
   (D) $A_3[MF_6]$:$Mn^{4+}$, where A is selected from Li, Na, K, Rb, Cs, $NH_4$, and combinations thereof; and where M is selected from Al, Ga, In, Sc, Y, La, a lanthanide, Bi, and combinations thereof;
   (E) $A_2[MF_7]$:$Mn^{4+}$, where A is selected from Li, Na, K, Rb, Cs, $NH_4$, and combinations thereof; and where M is selected from Nb, Ta, and combinations thereof;
   (F) $Zn_2[MF_7]$:$Mn^{4+}$, where M is selected from Al, Ga, In, and combinations thereof;
   (G) $Ba_{0.65}Zr_{0.35}F_{2.7}$:$Mn^{4+}$;
   (H) $A[In_2F_7]$:$Mn^{4+}$, where A is selected from Li, Na, K, Rb, Cs, $NH_4$ and combinations thereof; or
   (I) $A_3[MF_7]$:$Mn^{4+}$, where A is selected from Li, Na, K, Rb, Cs, $NH_4$, and combinations thereof, and where M is selected from Zr, Si, Ge, Sn, Ti, and Hf and combinations there of.

3. The phosphor material of claim 1, wherein the manganese-free fluoride phosphor is a material comprising at least one of:
   (A) $A_2[MF_6]$, where A is selected from Li, Na, K, Rb, Cs, $NH_4$, and combinations thereof; and M is selected from Ge, Si, Sn, Ti, Zr, and combinations thereof;
   (B) $A_2[MF_5]$, where A is selected from Li, Na, K, Rb, Cs, $NH_4$, and combinations thereof; and where M is selected from Al, Ga, In, and combinations thereof;
   (C) $E[MF_6]$, where E is selected from Mg, Ca, Sr, Ba, Zn, and combinations thereof; and where M is selected from Ge, Si, Sn, Ti, Zr, and combinations thereof;
   (D) $A_3[MF_6]$, where A is selected from Li, Na, K, Rb, Cs, $NH_4$, and combinations thereof; and where M is selected from Al, Ga, In, Sc, Y, La, a lanthanide, Bi, and combinations thereof;
   (E) $A_2[MF_7]$, where A is selected from Li, Na, K, Rb, Cs, $NH_4$, and combinations thereof; and where M is selected from Nb, Ta, and combinations thereof;
   (F) $Zn_2[MF_7]$, where M is selected from Al, Ga, In, and combinations thereof;
   (G) $Ba_{0.65}Zr_{0.35}F_{2.7}$;
   (H) $A[In_2F_7]$, where A is selected from Li, Na, K, Rb, Cs, NH4 and combinations thereof; or
   (I) $A_3[MF_7]$, where A is selected from Li, Na, K, Rb, Cs, NH4, and combinations thereof, and where M is selected from Zr, Si, Ge, Sn, Ti, and Hf and combinations there of.

4. A lighting apparatus, comprising:
   a light source; and
   a phosphor material radiationally coupled to the light source, and comprising individual particles of $Mn^{4+}$ (manganese) doped fluoride phosphor, wherein each particle is encapsulated with a manganese-free layer of the fluoride phosphor.

5. The lighting apparatus of claim 4, wherein the $Mn^{4+}$ (manganese) doped fluoride phosphor is a material comprising at least one of:
(A) $A_2[MF_6]:Mn^{4+}$, where A is selected from Li, Na, K, Rb, Cs, $NH_4$, and combinations thereof; and M is selected from Ge, Si, Sn, Ti, Zr, Hf and combinations thereof;
(B) $A_2[MF_5]:Mn^{4+}$, where A is selected from Li, Na, K, Rb, Cs, $NH_4$, and combinations thereof; and where M is selected from Al, Ga, In, Sc and combinations thereof;
(C) $E[MF_6]:Mn^{4+}$, where E is selected from Mg, Ca, Sr, Ba, Zn, and combinations thereof; and where M is selected from Ga, Si, Sn, Ti, Zr, Hf and combinations thereof;
(D) $A_3[MF_6]:Mn^{4+}$, where A is selected from Li, Na, K, Rb, Cs, $NH_4$, and combinations thereof; and where M is selected from Al, Ga, In, Sc, Y, La, a lanthanide, Bi, and combinations thereof;
(E) $A_2[MF_7]:Mn^{4+}$, where A is selected from Li, Na, K, Rb, Cs, $NH_4$, and combinations thereof; and where M is selected from Nb, Ta, and combinations thereof;
(F) $Zn_2[MF_7]:Mn^{4+}$, where M is selected from Al, Ga, In, and combinations thereof;
(G) $Ba_{0.65}Zr_{0.35}F_{2.7}:Mn^{4+}$;
(H) $A[In_2F_7]:Mn^{4+}$, where A is selected from Li, Na, K, Rb, Cs, NH4 and combinations thereof; or
(I) $A_3[MF_7]:Mn^{4+}$, where A is selected from Li, Na, K, Rb, Cs, NH4, and combinations thereof, and where M is selected from Zr, Si, Ge, Sn, Ti, and Hf and combinations thereof.

6. The lighting apparatus of claim 4, wherein the manganese-free fluoride phosphor is a material comprising at least one of:
(A) $A2[MF6]$, where A is selected from Li, Na, K, Rb, Cs, NH4, and combinations thereof; and M is selected from Ge, Si, Sn, Ti, Zr, and combinations thereof;
(B) $A_2[MF_5]$, where A is selected from Li, Na, K, Rb, Cs, $NH_4$, and combinations thereof; and where M is selected from Al, Ga, In, and combinations thereof;
(C) $E[MF_6]$, where E is selected from Mg, Ca, Sr, Ba, Zn, and combinations thereof; and where M is selected from Ge, Si, Sn, Ti, Zr, and combinations thereof;
(D) $A_3[MF_6]$, where A is selected from Li, Na, K, Rb, Cs, $NH_4$, and combinations thereof; and where M is selected from Al, Ga, In, Sc, Y, La, a lanthanide, Bi, and combinations thereof;
(E) $A_2[MF_7]$, where A is selected from Li, Na, K, Rb, Cs, $NH_4$, and combinations thereof; and where M is selected from Nb, Ta, and combinations thereof;
(F) $Zn_2[MF_7]$, where M is selected from Al, Ga, In, and combinations thereof;
(G) $Ba_{0.65}Zr_{0.35}F_{2.7}$;
(H) $A[In_2F_7]$, where A is selected from Li, Na, K, Rb, Cs, NH4 and combinations thereof; or
(I) $A_3[MF_7]$, where A is selected from Li, Na, K, Rb, Cs, NH4, and combinations thereof, and where M is selected from Zr, Si, Ge, Sn, Ti, and Hf and combinations there of.

7. The fighting apparatus of claim 4, wherein the light source is a semiconductor light emitting diode (LED) which emits radiation having a peak wavelength in the range of from about 370 to about 500 nm.

8. The lighting apparatus of claim 7, wherein the semiconductor light emitting diode comprises a nitride represented by the formula $In_iGa_jAl_kN$, where $0 \leq i$, $0 \leq j$, $0 \leq k$ and $1+j+k=1$.

9. The lighting apparatus of claim 4, wherein the light source is an organic emissive structure.

10. The lighting apparatus of claim 4, further comprising an encapsulant material surrounding the light source and the phosphor material within a housing.

11. The lighting apparatus of claim 10, wherein the encapsulant material comprises at least one silicone or epoxy material.

12. The lighting apparatus of claim 10, wherein the phosphor material is deposited on a surface of the light source.

13. The lighting apparatus of claim 10, wherein the phosphor material is dispersed in the encapsulant material.

14. The lighting apparatus of claim 10, wherein the phosphor material is deposited on a surface of the housing.

15. The lighting apparatus of claim 4, further comprising a reflective cup, wherein the light source is mounted in the reflective cup.

16. The lighting apparatus of claim 4, wherein the phosphor material further comprises one or more additional phosphors.

17. The lighting apparatus of claim 16, wherein at least one of the additional phosphors has an emission maximum in the range of about 430 to about 500 nm.

18. The lighting apparatus of claim 16, wherein at least one of the additional phosphors has an emission maximum in the range of about 500 to about 630 nm.

19. The lighting apparatus of claim 16, wherein at least one of the additional phosphors is a garnet activated with $Ce^{3+}$; an alkaline earth orthosilicate activated with $Eu^{2+}$; or $(Sr,Ca,Ba)_3(Si,Al)O_4(F,O)$ activated with $Ce^{3+}$.

20. The lighting apparatus of claim 16, characterized by the ability to produce white light.

21. A method of encapsulating manganese-doped fluoride phosphor particles, comprising:
(a) preparing a saturated solution of a manganese-free fluoride phosphor;
(b) mixing the saturated solution with manganese-doped fluoride phosphor powder in a vessel to form a suspension;
(c) evaporating the suspension until a paste is formed; and
(d) drying the paste so as to produce a powder comprising encapsulated particles.

22. The method of claim 21, wherein the saturated solution is prepared in an acid which comprises at least one of HF, $NH_4HF_2$, or $NH_4F$.

23. The method of claim 21, wherein mixing comprises pouring the saturated solution onto manganese-doped fluoride phosphor powder in the vessel with continuous stirring.

24. The method of claim 21, wherein the paste is dried in a dry-box atmosphere at about 10 degrees Celsius to about 300 degrees Celsius.

* * * * *